United States Patent [19]
Fletcher et al.

[11] 4,360,410
[45] Nov. 23, 1982

[54] ELECTROPLATING PROCESSES AND EQUIPMENT UTILIZING A FOAM ELECTROLYTE

[75] Inventors: Ivan M. Fletcher, Carmel; Richard H. Meier, Indianapolis, both of Ind.

[73] Assignee: Western Electric Company, Inc., New York, N.Y.

[21] Appl. No.: 241,333

[22] Filed: Mar. 6, 1981

[51] Int. Cl.³ .................. C25D 5/08; C25D 17/00
[52] U.S. Cl. ............................... 204/23; 204/237; 204/277
[58] Field of Search ................... 204/23, 237, 277

[56] References Cited
U.S. PATENT DOCUMENTS

| | | | |
|---|---|---|---|
| 1,260,830 | 3/1918 | Studt | 204/277 |
| 3,104,221 | 9/1963 | Hill | 204/237 |
| 3,284,327 | 11/1966 | Maeda | 204/277 |
| 3,483,049 | 12/1969 | Grubbe | 156/5 |
| 3,669,852 | 6/1972 | Winters | 204/277 |
| 4,152,221 | 5/1979 | Schaedel | 204/33 |
| 4,208,255 | 6/1980 | Stahl | 204/72 |

Primary Examiner—T. Tufariello
Attorney, Agent, or Firm—R. F. Kip, Jr.; J. L. Landis

[57] ABSTRACT

Improved electroplating processes and equipment, in which an inert gas (21) is mixed with a liquid electrolyte (20) to form a foam (23) of the gas plus electrolyte, which foam is then circulated (arrows A) through an electroplating chamber (30) in which anodes (12) and cathode substrates (10) are mounted so as to plate a metal from the foam electrolyte onto the cathodic surfaces of the substrates. Preferably, the gas is nitrogen or argon and the electrolyte may be any of various conventional plating solutions, such as a potassium gold cyanide solution in a specific example of a gold-plating process described in detail. The foam process provides improvements in uniformity of the thickness of the plated metal and in the surface appearance.

13 Claims, 5 Drawing Figures

ELECTROPLATING PROCESSES AND EQUIPMENT UTILIZING A FOAM ELECTROLYTE

TECHNICAL FIELD

This application relates generally to electroplating processes and apparatus for depositing a metal on a cathode substrate mounted in a plating cell, and more particularly to improved plating processes and equipment utilizing a foam electrolyte composed of a mixture of an inert gas and a conventional liquid electrolyte.

BACKGROUND OF THE INVENTION

In various prior-known plating processes, one or usually many articles to be plated are mounted in an electroplating cell as cathodes, one or more anodes are mounted in the cell in spaced relationship to the cathodes, a liquid electrolyte is circulated through the cell between the anodes and cathodes, and a plating potential is applied between the anodes and cathodes so as to plate metal from the electrolyte onto selected surfaces of the articles. In one typical example referred to as a box-plating process, gold is plated onto conductive metal areas of a plurality of "thin-film" circuit substrates from a circulating potassium gold cyanide plating solution, wherein a number of the substrates are mounted as cathodes in a plating tank in parallel between a plurality of facing inert anodes so that gold is deposited on the metallic areas of the substrates.

In this type of plating process involving continuous circulation of a liquid electrolyte between a number of parallel anodes interspersed between a number of parallel cathode substrates in a plating tank, problems are encountered in nonuniformity of the thickness of the plated metal between various areas along the surface of a single substrate and also between two different substrates positioned at different locations in the same tank. Such nonuniformity in plating thickness can lead to defective circuits where not enough metal or too much metal is deposited at any specified region. Such nonuniformity can also result in wastage of plated metal in that too much may be plated on many areas of the substrates in a batch to assure that the sparsest areas are sufficiently thick, which is particularly important in the plating of precious metals such as gold. In addition, such nonuniform plating can result in defects in the physical appearance of the plating, particularly in this type of gold plating process for depositing gold films of the order of 12,000 to 18,000 angstroms.

SUMMARY OF THE INVENTION

A specific object of the invention is to provide improvements in continuous-circulation electroplating processes and equipment of the type described above, such as potassium gold cyanide plating processes, to provide increased uniformity in the thickness of the plated metal across the entire surface of each substrate and between one substrate and another that are plated simultaneously at different positions in a plating tank, to reduce the amount of plating metal required to achieve a minimum thickness of all points, and to improve the physical appearance of the plated finish.

More general objects are to provide improved plating processes and equipment of the type wherein one or more articles to be plated are mounted in an electroplating cell as cathodes, an anode is mounted in the cell in spaced relationship to each cathode, a liquid electrolyte is circulated in the cell between each anode and cathode, and a plating potential is applied between the anodes and cathodes so as to plate a metal from the electrolyte onto a surface of the article or articles.

With the foregoing and other objects in view, an improved plating system in accordance with certain features of the invention includes mixing an inert gas with a liquid electrolyte to form a foam of the gas plus electrolyte, and circulating such foam through the plating cell while applying the plating potential so that the metal is plated from the foam electrolyte onto the surface of the article. Specific advantages of the foam plating technique relate to improved uniformity in the thickness of the plated metal, reduction in the amount of metal required, and improvement in the physical appearance of the plated finish.

In accordance with specific examples of the invention, the inert gas is argon or nitrogen and the plated metal is gold, although various other metals are considered to be applicable such as copper or palladium. One specific example discussed in detail relates to the plating of gold from conventional potassium gold cyanide solutions onto selected pattern areas of a plurality thin film circuit substrates, wherein typical ratios of the inert gas to the plating solution are between about 8% and about 15% of the gas by volume calculated at standard temperature and pressure. The mixing step may include pumping the liquid electrolyte into a mixing chamber, while simultaniously forcing the gas under pressure into the chamber so as to form the foam electrolyte in the chamber, from which the electrolyte foam is forced through a feed tube having an outlet opening in the plating cell at a region located beneath the anodes and cathodes, so that the foam flows upwardly through the cell between the anodes and cathodes and then overflows from an upper portion of the cell, after which the gas escapes and the used electrolyte liquid can be recycled.

Other objects, advantages and features of the invention will be apparent from the following detailed description of specific examples and embodiments thereof, when read in conjunction with the appended drawings.

DETAILED DESCRIPTION

Introduction and Background

Figure 1:
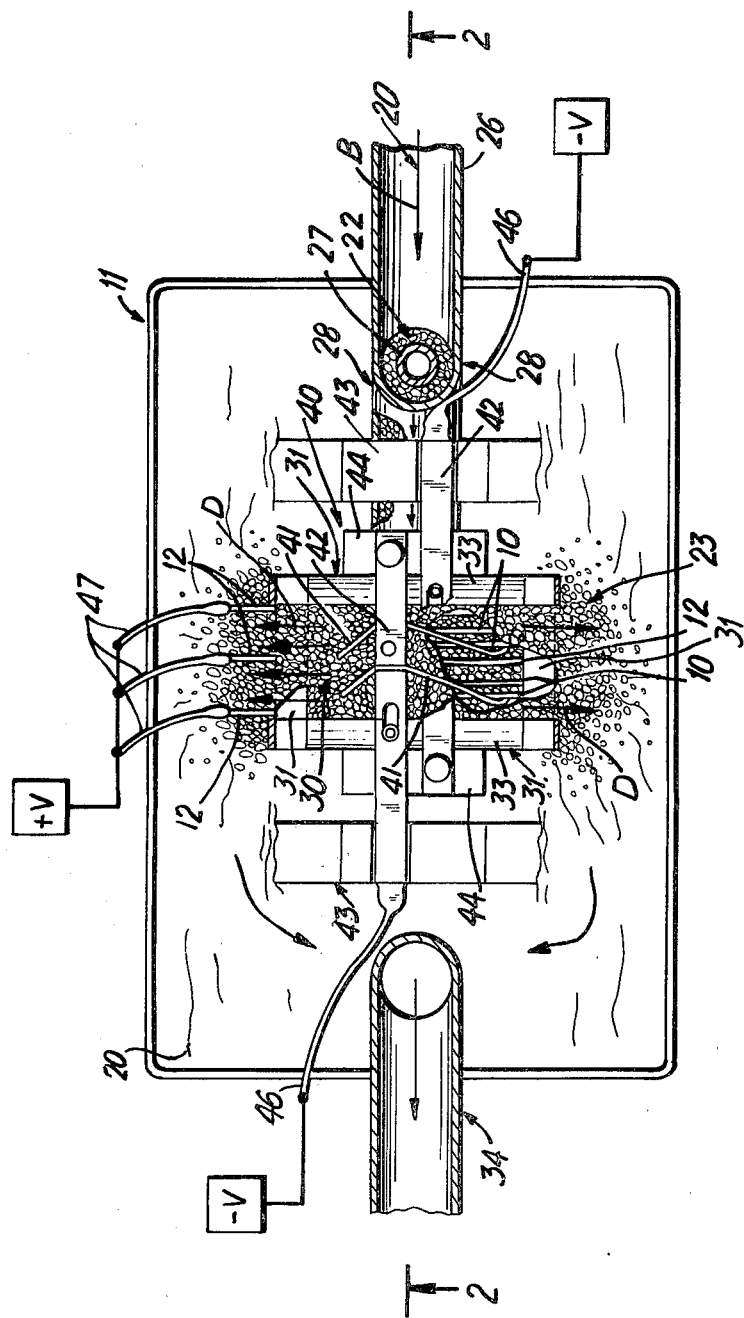
FIG. 1 is a plan view of foam-plating apparatus in accordance with one specific embodiment of the invention, partly in horizontal section along line 1—1 of FIG. 2.
Figure 2:
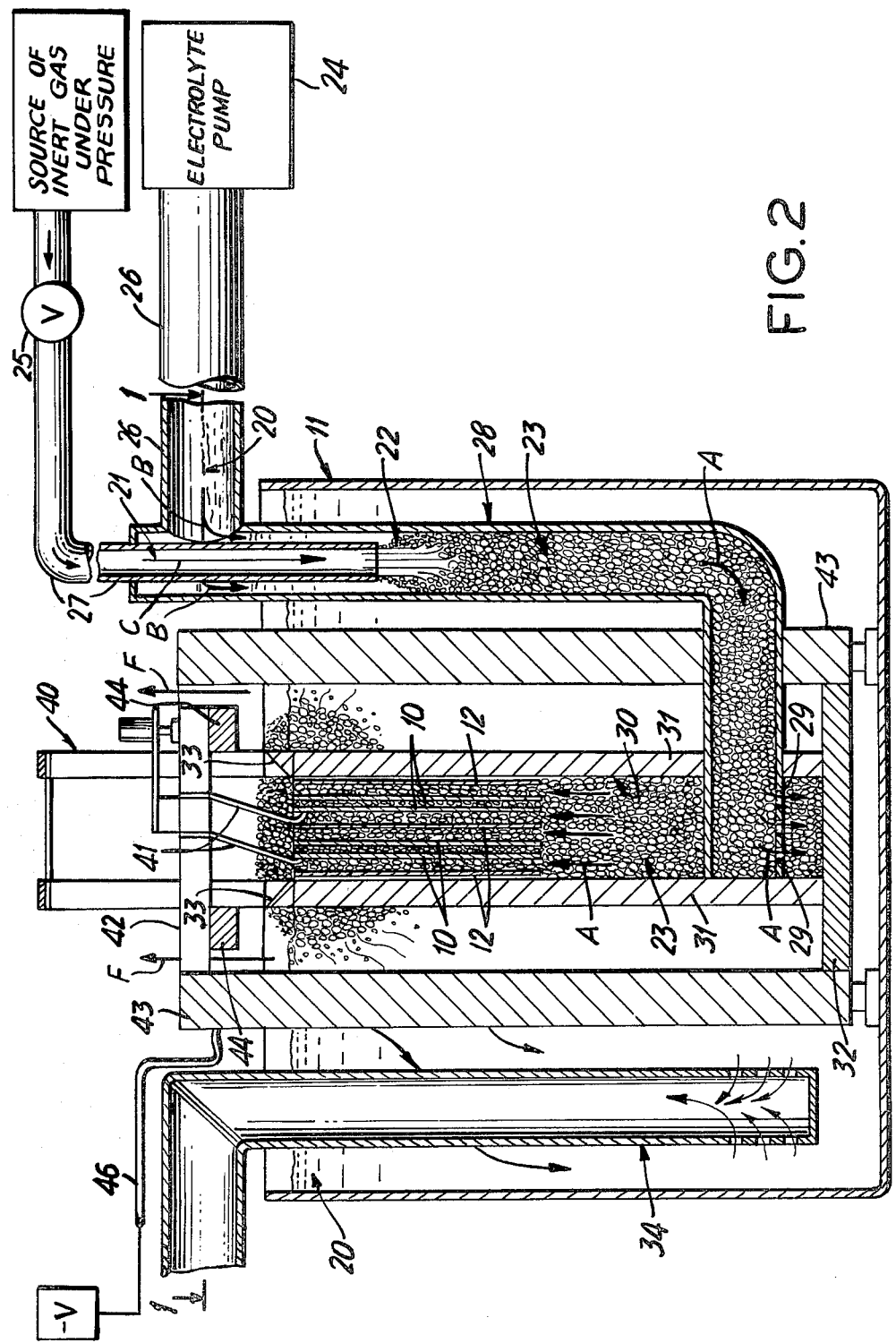
FIG. 2 is a vertical cross section of the apparatus along line 2—2 of FIG. 1.

Referring now in detail to the drawings and particularly to FIGS. 1-2, electroplating equipment in accordance with one specific embodiment of the invention is illustrated for plating a metal such as gold onto selected portions of the surface of one or more articles to be plated, such as a plurality of flat rectangular thin-film circuit substrates 10—10 in this example. In this installation, a plurality of the substrates 10 are mounted vertically in a generally conventional box plating tank 11 as cathodes, and a plurality of flat rectangular anodes 12—12 are mounted vertically in the tank adjacent to the substrates so that each substrate surface to be plated is positioned in predetermined spaced relationship to a facing surface of a companion anode 12. In the example illustrated, there are four parallel cathode substrates 10 suspended vertically in a central plating area or cell of the tank 11 interspersed with three parallel anodes 12. In this example, only one surface of each substrate is to be plated, as is conventional in the plating of thin-film circuits having circuit patterns to be plated deposited on only one surface of a glass or ceramic substrate. This arrangement is also representative of the anode-cathode layouts utilized in larger installations, for example to simultaneously plate thirty-four substrates interspersed with nineteen anodes in a typical fairly large-scale production unit of this type so that there is between each cathode and a cooperating anode a vertical passage extending in its vertical or end-to-end direction transversely of the horizontal spacing of such two electrodes.

In this type of process, an electrolyte is continuously circulated through the central plating area of the tank 11 between the anodes and cathodes while a plating potential ($+V$, $-V$) is applied between the anodes and cathodes so as to plate the metal from the electrolyte onto the conductive surfaces of the substrates 10 as is generally conventional. Apart from the improvements discussed in the following paragraphs relating to the formation of a foam electrolyte for use in such a plating process, the general layout illustrated in FIGS. 1 and 2 of the plating tank 11 and of the substrates 10 and anodes 12 mounted within the tank is generally conventional and is typical of prior-known box-plating equipment of the type discussed above. In the conventional process, a liquid electrolyte is pumped into the plating region of the tank 11 through an inlet near the bottom thereof, and is then circulated upwardly between the anodes and cathodes to an overflow outlet, from which the used electrolyte is collected in the tank and then recirculated through a filtration system.

The Improved Process

In accordance with the improved process, a conventional liquid electrolyte 20 is first mixed with an inert gas 21, such as nitrogen or argon, in a mixing chamber 22 so as to form a foam 23 of the gas plus electrolyte, which foam is then circulated through the system as indicated by arrows A—A, while applying the plating potential so that the metal is plated from the foam electrolyte onto the selected portions of the surfaces of the substrates 10. In the example illustrated, the liquid electrolyte 20 is pumped by a conventional pump 24 through a liquid inlet pipe 26 into the chamber 22, as indicated by arrows B—B, while the gas 21 is a simultaneously forced under pressure from source means thereof into the chamber 22, as indicated by arrow C, through a conventional flow-control valve 25 and a gas inlet pipe 27 emptying into the chamber 22 so that the gas and liquid mix in the chamber 22 to form the foam electrolyte 23 in the chamber 22 as illustrated in FIG. 2. In this embodiment, the mixing chamber 22 is formed in a relatively large diameter, L-shaped feed tube 28 having a vertical section with a closed upper end arranged as illustrated in FIG. 2. The electrolyte liquid 20 is pumped into the upper end of the tube 28 from the liquid-inlet pipe 26 and flows downwardly into the mixing chamber as indicated by arrows B—B, while the gas inlet pipe 27 enters the closed upper end of the tube 28 through a hermetic seal and extends concentrically within the upper end of the tube 28 so that the foaming process occurs in the mixing region or chamber 22 of the feed tube 28 located just below the discharge end of the gas inlet pipe 27.

From the mixing chamber 22, the pressurized liquid-gas mixture of the electrolyte foam 23 thus formed is forced by the pump pressure and gas pressure downwardly through the feed tube 28 and horizontally inward through the L-shaped lower end of the tube 28 to the center of the cell, such lower vertical and horizontal portions of feed tube 28 providing a fluid-conducting or conduit means from mixing chamber 22 for the liquid-gas mixture 23 (othertimes referred to herein as the foam or foam electrolyte). From this point, the foam 23 flows out into the cell through outlet openings 29—29 formed at the inner end of the tube 28 and located at an inner plating cell or chamber 30 of the tank beneath the anodes 12 and cathodes 10. In this example, the plating chamber 30 is an open-topped rectangular chamber having a square U-shaped cross section and defined by a set of four spaced vertical plates or walls 31—31 at the sides (FIG. 2) and at the front and rear (FIG. 1), and including a horizontal plate or floor 32 at the bottom. The walls 31—31 are positioned in closely spaced parallelism to the outer electrodes (two of the anodes 12—12 in this case) and are somewhat longer than the anodes and cathodes so as to enclose the anodes and cathodes to define an enclosed plating chamber 30 through which the electrolyte foam 23 is circulated as indicated by arrows A—A. From the inner end of the feed tube 28, the foam 23 flows first downwardly through the outlet openings 29—29 into the plating chamber 30, thence upwardly through the chamber 30 and through the mentioned passages between the anodes and cathodes suspended in the chamber for the electroplating process as described above. Such flow is, of course, impelled by the pressurization of the liquid-gas mixture 23.

After passing the upper ends of the cathodes 10 and anodes 12 in the chamber 30, the foam spills outwardly over the upper ends of the front and rear chamber walls 31—31, as indicated by arrows D in FIG. 1, and into the outer reservoir portions of the tank 11 surrounding the central plating chamber 30. The side walls 31—31 of the chamber 30 are formed with angled upper edges 33—33, as illustrated in FIG. 2, extending above the level of the front and rear walls to prevent the foam 23 from flowing out of the chamber over the side walls. As the foam 23 thus reaches and spreads out along the surface of the liquid 20 in the outer tank 11, the inert gas bubbles out and escapes to an exhaust system at the top, as indicated by arrow F in FIG. 2. With this arrangement, the outer tank 11 functions as a reservoir for temporarily holding a considerable supply of the used electrolyte liquid for recycle. The level of the liquid in the outer tank 11 is maintained at about the same level as the upper ends of the anodes and cathodes in the plating chamber 30, so as to insure that the rising foam 23 in the chamber 30 must flow upward above the tops of the anodes and cathodes before spilling out into the outer tank 11. From the outer tank 11, the used liquid electrolyte 20 is recycled by continuously pumping the liquid out of the tank via an outlet pipe 34 having an inlet end positioned near the floor of the tank 11 as illustrated, and returning the liquid 20 to the liquid pump 24 via a conventional recirculation filtration system.

The apparatus for mounting the cathode substrates 10 and the anodes 12 in the desired positions in the tank 11 and for connecting them to the source of plating potential is generally conventional and, in the embodiment illustrated, includes a plating fixture 40 mounted at the top of the chamber 30. The substrates 10 are connected by cathode contacts 41 alternately to a pair of horizontal cathode contact bars 42—42 mounted across the top of the plating chamber 30 as illustrated between an outer vertical support member or wall 43 and a horizontal crosspiece 44 of the fixture 40. The outer support walls 43 are mounted on the floor of the tank 11 as illustrated, on either side of the central plating chamber 30, and the bottom plate 32 of the chamber is mounted between the outer walls 43—43 near the floor of the tank. The cathode bars 42 are connected to the source of cathode potential (−V) in conventional fashion by electrical connections 46—46 extending out over the top of the tank 11 at the left and right sides thereof as illustrated in FIG. 1. The anode plates 12 are separately mounted in the chamber 30 as illustrated, and are connected to the source of anode potential (+V) by conventional electrical connections 47 extending outward from the rear of the tank 11 as illustrated in FIG. 1.

EXAMPLES

Various test runs have been made with the new foam plating process to compare it to the prior standard liquid plating process, using the same process conditions and plating equipment except for the foaming generating features described above. In all of these examples, gold was plated from a conventional potassium gold cyanide plating solution onto a surface of a thin-film substrate having a cathode contact surface consisting of an outer layer of palladium on an inner layer of titanium deposited uniformly across one outer surface of a rectangular ceramic thin film substrate 4.5 inches long by 3.75 inches wide (approximately 11.5 cm×9.5 cm). The anodes 12 were conventional inert anodes consisting of thin flat rectangular plates of platinized titanium. The liquid electrolyte 20 consisted of an aqueous solution of the following ingredients:

(1) Potassium gold cyanide—20 grams per liter;
(2) Dibasic ammonium citrate—50 grams per liter.

The substrates were plated in a fixture as illustrated in FIGS. 1-2, using an electrolyte flow rate of about fifteen gallons per minute (approximately 57 liters/min.) at a cathode current density of about 7.75 ma/cm$^2$ to deposit gold plate on the substrates having a desired thickness in the range of 13,000 to 20,000 angstroms, which is typical of the gold-plated conductor areas utilized in this type of thin film circuit.

EXAMPLE I

In a first experimental run, comparable conditions as described above were used to gold plate a series of substrates 10, half using the foam-plating process as described above and half using the standard liquid-plating process. In the foam electrolyte samples, argon gas at a flow rate of about twelve standard cubic feet (SCF) an hour (approximately 0.34 standard cubic meters/hour) was forced into the system under a pressure of 12 psig (9437 kg. per square meter), to form an argon-electrolyte foam 23 as described above. Sheet resistance measurements were taken of the gold plate at sixteen separate locations along the plated surface of the substrates, using a four-point probe, which measurements are related to the thickness of the gold plate as discussed hereafter. Analysis of these samples indicated a 68% improvement in uniformity of the deposited gold using the foam plating process and a 9.6% reduction in the total amount of gold plated. The foam-plated substrates met all requirements for good circuit production.

EXAMPLE II

In a second experimental run, a series of substrates were plated both with the foam-plating process and the standard process as described in Example I, except that nitrogen was used as the inert gas instead of argon. These samples provided similar data including a 64.6% improvement in uniformity of the gold plate and a 7.7% reduction in the amount of gold deposited. In view of the nearly comparable results obtained using nitrogen as the inert gas instead of argon and of the considerably lower price of nitrogen, nitrogen was selected as the preferred gas for use in the process and further experiments were performed as described in the following paragraphs, using nitrogen-electrolyte foams.

EXAMPLE III

Additional runs were made to collect further data on the results using the new foam plating process as compared to normal flow, in which six lots of thirty-four substrates each were plated, half using the foam-plating process and half using the liquid-plating process as described in Example II. The plating parameters and equipment were the same in all cases, except for the addition of nitrogen gas to form the foam electrolyte in three of the runs as described in Example II. To establish data as to the thickness and uniformity of the gold plate in these examples, the sheet resistance of the gold plate in each sample was measured at sixteen different locations along the plated surface of each substrate. In this connection, the following table indicates the inverse correlation between the sheet resistance measurements and the thickness of the gold plate.

| Gold thickness in angstroms (Å) vs. sheet resistance in milliohmns per square (mps) | | |
| --- | --- | --- |
| SHEET RESISTANCE (mps) | GOLD THICKNESS (Å) | |
| 48.0 | 5,000 | Too little gold |
| 40.0 | 6,000 | |
| 34.0 | 7,000 | |
| 30.0 | 8,000 | |
| 26.0 | 9,000 | |
| 24.0 | 10,000 | |
| 22.0 | 11,000 | |
| 20.0 | 12,000 | Acceptable range |
| 18.0 | 13,000 | |
| 17.0 | 14,000 | |
| 16.0 | 15,000 | |
| 15.0 | 16,000 | |
| 14.0 | 17,000 | |
| 13.0 | 18,000 | |
| 12.5 | 19,000 | Too much gold |
| 12.0 | 20,000 | |
| 9.5 | 25,000 | |
| 7.9 | 30,000 | |

As indicated in the above table, in the particular thin-film circuit plating operation under consideration, the gold plate is within an acceptable range of thickness if it has a sheet resistance of between 20 and 13 millohms per square, which corresponds to a thickness of 12,000–18,000 angstroms of gold. If the sheet resistance is above 20 mps, the gold plate is too thin and, if below 13 mps, the plate is too thick to meet good circuit requirements for the finished thin-film circuits.

Figure 3:
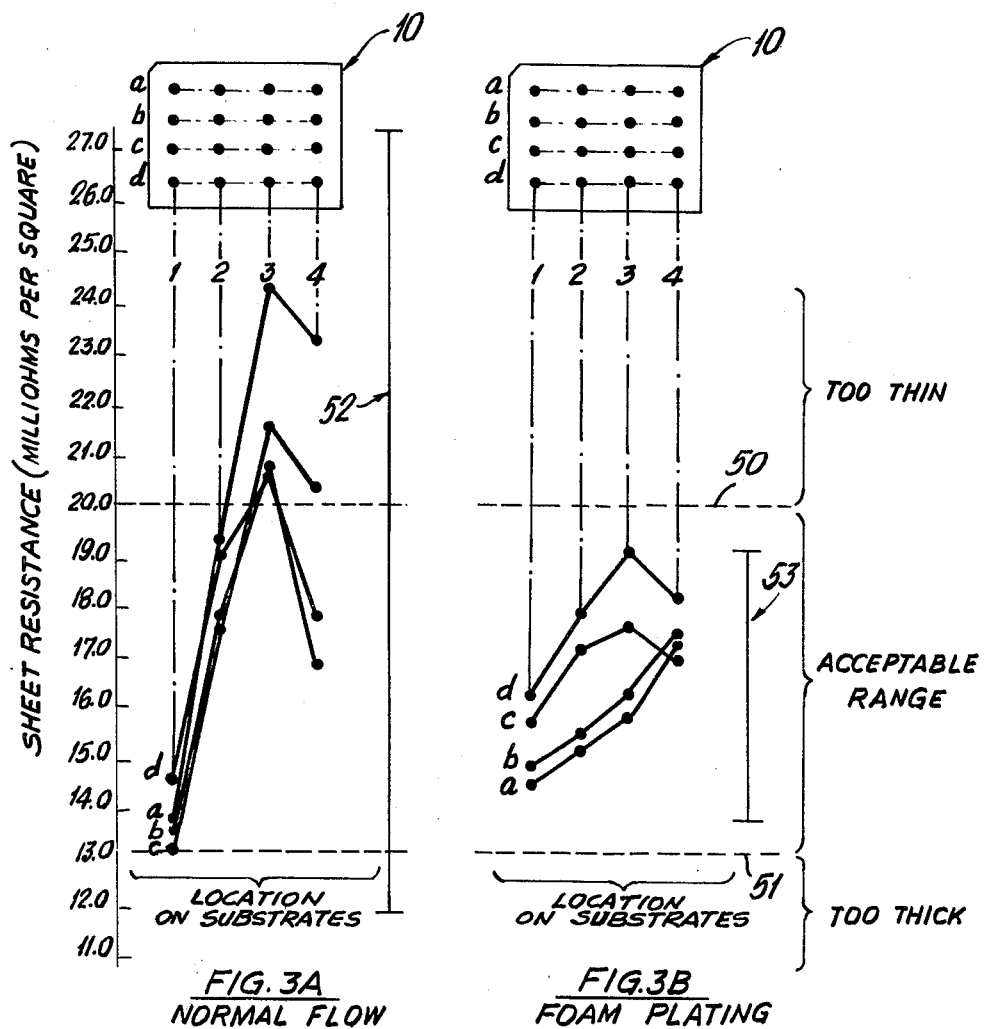
FIGS. 3 and 4 are graphs of the sheet resistance of gold plate at various positions along substrates in specific examples of the improved process and the prior standard process, indicating variations in the uniformity of the plated gold.

Some of the data collected during these runs are illustrated in FIG. 3, which is a graph of the average sheet resistance of the deposited gold at various different points on six of the sample substrates, in which FIG. 3A at the left depicts three substrates produced with the normal flow process and FIG. 3B illustrates the same date for three corresponding substrates plated with the foam plating process. Above the graphs of FIGS. 3A and 3B are depicted sample plated substrates 10 illustrating the sixteen points (a-1 through d-4) on the surface of the substrate at which the sheet resistance was measured, arranged in a four-by-four x-y grid as illustrated. The graph in FIG. 3A indicates the average sheet resistance at each of the sixteen points for the three substrates plated with the normal flow process, and FIG. 3B illustrates the corresponding data for three foam plated substrates that were plated in the same positions in the plating fixture at the corresponding substrates in FIG. 3A. In FIG. 3, the horizontal lines 50 and 51 indicate the acceptable limits for the gold plate as discussed above, in which resistance measurements above the line 50 indicate that the gold plate is too thin and below the line 51 that the gold is too thick.

The vertical line 52 in FIG. 3A indicates the total range of all forty-eight readings taken on the normal flow samples, while the corresponding line 53 in FIG. 3B indicates the range for the foam plated samples. These data indicate that 39.6% of all measurements were out of the acceptable range in the normal flow process, while none of the forty-eight measurements were out of range in the foam plated samples. The graph FIG. 3A indicates the pronounced variations in average uniformity of the gold at different points on the surfaces of the substrates in the standard process, while FIG. 3B depicts the improvements in uniformity achieved with the foam plating process. In FIG. 3A, the averaged readings indicate a variation of ±5.7 mps about a nominal value of 18.3 mps, and that 37.3% of the averaged readings were out of the acceptable range. The corresponding graph FIG. 3B indicates a variation of ±2.3 mps about a nominal value of 16.5 mps, in which all of the readings were within the acceptable range.

Figure 4:
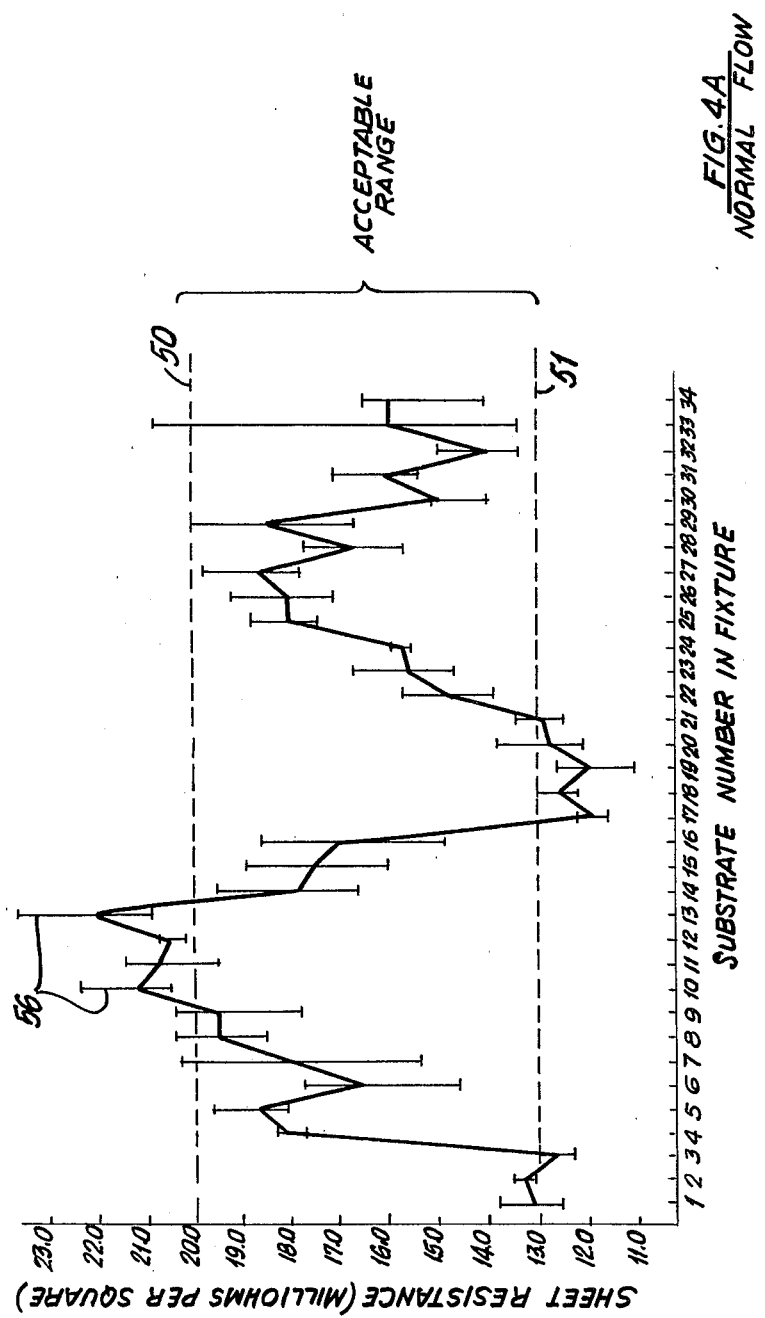
Figure 4:
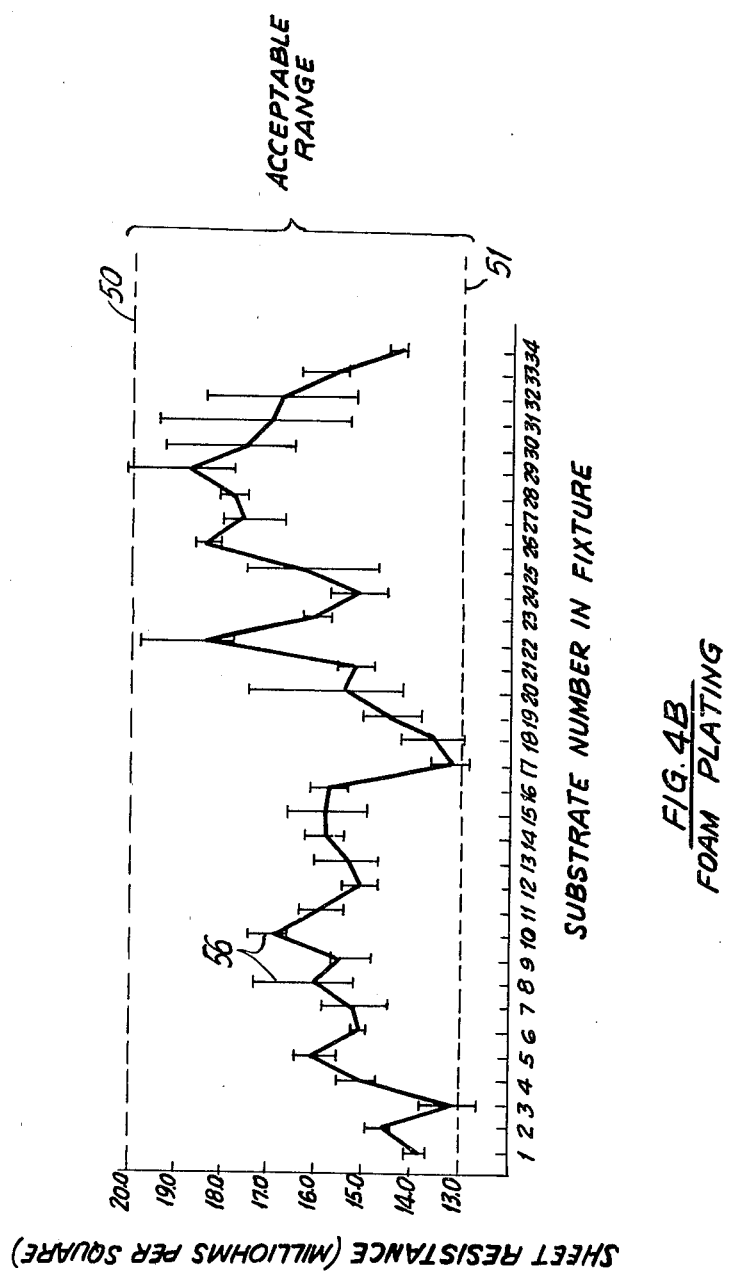

FIGS. 4A and 4B are somewhat similar graphs indicating variations in sheet resistance at corresponding points of the plated substrates as a function of the location of the substrate in the plating fixture for both the normal flow process (FIG. 4A) and the foam plating process (FIG. 4B). In FIG. 4, the position of each substrate in the fixture is numbered from 1 to 34, for example from left to right in FIG. 2 from one side of a chamber such as 30 to the other, and these numbers are indicated along the X axis in FIG. 4. The sheet resistance at the center of each of the 102 substrates produced by each process was measured, and the average results for the three lots are plotted in each case in the graphs by the location of the substrate in the fixture. The total range of resistance at each location is also indicated by the vertical tracks 56—56 extending above and below each point on the graphs.

These graphs indicate the considerable variations in plating uniformity from substrate to substrate along a row of identical substrates in a single plating fixture, and FIG. 4B indicates that these position variations are smoothed out substantially by the foam plating process. The data illustrated in FIG. 4A indicate that, using the normal flow process, 29.4% of all center measurements were out of range and 29.1% of the average measurements were of range. FIG. 4B displays the corresponding data using the foam plating process, in which 2.9% of all readings were out of range and 0% of all average points were out of range.

In these runs, uniformity of the gold plating was improved by 60% when using the new foam plating process. In addition, the yield of substrates meeting the gold resistance requirements for good circuit production has been improved from 84% to 99% by the use of the foam-plating process, and the process has not shown any degradation of the circuit production. Further, the physical appearance of the gold plate has been improved with the foam plating process, in that the foam-plated gold is entirely uniform in appearance, whereas the gold deposited with the prior liquid process has a wavy surface appearance resulting most likely from variations in the thickness of the plating.

In addition, it has been observed that, when using the new foam-plating technique in a selective plating process where the cathode substrates are masked with photoresist to define conductive pattern areas to be gold plated, the foam-plating process reduces both photoresist lifting and underplating of the gold beneath the edges of the photoresist mask.

Theoretical Considerations

While the precise reasons for the above-described improvements in the plating process are not fully understood, and while applicants do not intend to be limited to any particular theory of operation, applicants believe that the use of a gas-electrolyte foam 23 as described above causes a more random and violent movement of the electrolyte and the substrate surfaces to be plated, both at different points on the surface of each individual substrate in the row, ad depicted in FIG. 3, and also at corresponding points along a row or parallel substrates 10 in a single fixture 40, as illustrated in FIG. 4.

However, whatever may be the theoretical explanations and considerations, the improvements flowing from the use of the new foam-plating techniques have been clearly established. While applicants experiments have thus far been limited to potassium gold cyanide solutions of the type described above, using argon or preferably nitrogen as the inert gas to create the foam electrolyte, applicants believe that the improved process can be employed equally well with other inert gases and with other plating solutions for either gold or other metals in various plating processes of the type wherein an electrolyte is circulated through an electroplating tank or cell between anodes and cathodes to be plated, using either anodes of the inert type as in the potassium gold cyanide process or reactive anodes that dissolve in process.

As one specific example of another application of the process, applicants believe that the foam plating process can be well utilized in a conventional copper-plating process utilizing oxygen-free copper anodes and an aqueous electrolyte solution containing 17% by weight of cupric sulfate and 2.3% by weight of sulfuric acid, in which the electrolyte is pumped through a box plating tank and recirculated in the same general manner described above for gold plating. Another typical example of a process that applicants believe can be improved by this foam-plating process is referred to as the "PALLASPEED* High Speed Bright Palladium" plating process, utilizing a proprietary formulation described as follows in the Technic, Inc. literature:

*Registered trademark of Technic Inc., Providence, R.I.

"PALLASPEED" is an organically-brightened high speed palladium plating solution which is capable of operating over a temperature range from room ambient to over 130° F. The deposits are bright, ductile, and exceptionally tarnish-resistant. The bath operates at a slightly acid pH, and deposits can be applied directly to nickel or copper-based alloys without the use of a strike.

| "MAKEUP: | 1 gallon |
|---|---|
| Monopotassium Phosphate | 1.25 pounds [565 gm] |
| PALLASPEED Carrier Brightener CB-1 | 4 ounces [114 gm] |
| PALLASPEED Booster Brightener BB-2 | 15 ml. |
| PALLASPEED Additive S-1 | 5 ml. |
| Palladium as PALLASPEED concentrate | 10-60 gm." |

This palladium plating process is another example of a process which is commonly used with circulating electrolyte and with plating equipment of the general type described above for gold plating, in which use of a foam electrolyte should be productive in improving uniformity of the deposited palladium.

In general the flow rates of the liquid electrolyte and of the gas, and the ratio of gas to liquid, do not appear to be critical so long as the ratio is effective to product an electrolyte foam as described above. Utilizing a generally standard electrolyte flow rate of fifteen gallons per minute, (approximately 57 liters/min.), as is typical in this type of potassium gold cyanide plating process, the nitrogen gas flow rate was varied from a minimum of ten standard cubic feet (SCF) per hour to a maximum of fifty-five SCF per hour, (approximately 0.28-1.56 std. cubic meters/hr.), the highest gas flow rate applicants' facilities would permit, and the foam plating process worked effectively over this range. In this example, the ten SCF gas flow rate corresponds to a foam containing approximately 8.3% gas by volume calculated at standard temperature and pressure, and the fifty-five SCF flow corresponds to about 45% gas by volume. However, since very high gas flow rates are not required to produce the desired improvements, in general a gas to liquid ratio between about 8% and about 15% by volume of the gas at stp constitutes a preferred operating range for the process. For the specific gold plating operations described above, a gas flow rate of 12-15 SCF per hour (0.34-0.42 SCM per hour) has been selected based on the standard liquid flow rate of 15 gallons per hour, which corresponds to approximately 10 to 12.5% by volume in this specific application of the process. Obviously, the optimum gas and liquid flow rates will vary for different processes using different gases and various electrolytes, and these flow rates and ratios should be established empirically to achieve the particular results desired for each particular plating process.

In view of the foregoing description of specific examples and embodiments of the invention, it should be apparent that there has been provided simple and effective improvements in electroplating processes of the type described by first forming a gas-electrolyte foam and then circulating such a foam electrolyte through the plating cell. As described above, the new foam-plating process provides significant improvements in uniformity of the plated metal, thus reducing the amount of metal required to achieve a desired minimum plate thickness across the surface of the article being plated and particularly across the surface of a number of parallel articles being plated simultaneously, and correspondingly improving the product yields wherever there are maximum and minimum thickness ranges established for good product. In addition, the process improves the physical appearance of the plated layer. While various specific embodiments and examples of the practice of the invention have been described in detail above, it should be apparent that various modifications may be made from the specific details described without departing from the spirit and scope of the invention.

What is claimed is:

1. An improved electroplating process of the type wherein an article to be plated is mounted in an electroplating cell as a cathode, an anode is mounted in the cell in spaced relationship to the cathode to provide therebetween a passage extending in its end-to-end direction transversely of the spacing between such electrodes, a liquid electrolyte is circulated in the cell between the anode and cathode, and a plating potential is applied between anode and cathode so as to plate a metal from the electrolyte onto a surface of the article, wherein the improvement comprises:

pumping the liquid electrolyte under pressure into a chamber outside the cell while simultaneously injecting into said liquid in said chamber an inert gas under pressure so that the gas mixed with the liquid in the chamber to form therein a a pressurized mixture of such gas plus such liquid constituted by volume of the mixture from about 8% to about 45% of such gas, forcing such liquid-gas mixture by pressure from the mixing chamber and through fluid conducting means to opening means into said cell adjacent to one end of such passage so as to cause through said passage between said anode and cathode a flow of such liquid-gas mixture impelled to so flow by the pressurization thereof, and simultaneously applying said plating potential so that the metal is plated from such mixture in said passage onto said surface of the article.

2. A process as recited in claim 1, wherein the inert gas is argon or nitrogen.

3. A process as recited in claim 2, wherein the metal is gold.

4. A process as recited in claim 3, wherein the electrolyte is a potassium gold cyanide solution and the anode is an inert electrode.

5. A process as recited in any of claims 1-4, wherein the ratio of the gas to the electrolyte is between about 8% and about 15% gas by volume calculated at standard temperature and pressure.

6. A process as recited in claim 1, wherein a plurality of cathode substrates to be plated are mounted in the cell in a parallel row, a plurality of parallel anodes are mounted in the cell adjacent to the substrates so that each substrate surface to be plated is positioned in predetermined spaced relationship to a facing surface of a companion anode to provide a passage therebetween, and wherein the the liquid-gas mixture is circulated through a plating region of the cell and through the passages between the anodes and cathodes.

7. A process as recited in claim 1 in which said anode and cathode are horizontally spaced from each other and said passage is a vertical passage, and in which said liquid-gas mixture is introduced into said cell beneath said anode and cathode and flows upwardly through said passage and then overflows from an upper portion of the cell above the levels of said anode and cathode elements.

8. A process as recited in claim 1 in which said liquid-gas mixture flows from said opening means into such cell and then through such cell so as to fill substantially all of the interior cross section of such cell which is normal to the flow direction of such liquid-gas mixture.

9. Improved electroplating apparatus of the type wherein an article to be plated is mounted in an electroplating cell as a cathode, an anode is mounted in the cell in spaced relationship to the cathode to provide therebetween a passage extending in its end-to-end direction transversely of the spacing between such electrodes, a liquid electrolyte is circulated in the cell between the anode and cathode, and a plating potential is applied between anode and cathode so as to plate a metal from the electrolyte onto a surface of the article, wherein the improvement comprises:

a mixing chamber outside said cell, pump means for pumping under pressure the liquid electrolyte into the chamber, source means of inert gas under pressure, said source means being coupled to said chamber to introduce such pressurized gas thereinto so that the gas is injected into and, mixes therein with, the pumped liquid to form in such chamber a pressurized mixture of such gas plus such liquid constituted by volume of the mixture of from about 8% to about 45% of such gas, and conduit means for conducting such liquid-gas mixture under force from the pressurization thereof from said chamber to opening means into said cell adjacent to one end of said passage so as to cause through said passage between such anode and cathode a flow of such mixture impelled to so flow by the pressurization thereof while such plating potential is being applied and, thereby, plating of metal from such mixture in such passage onto said surface of the article.

10. Apparatus as recited in claim 9, wherein a plurality of anodes and cathodes are mounted in parallel in a plating region of the cell for simultaneous plating of the cathodes; and wherein the fluid conducting means includes a feed tube connected to the mixing chamber and having an outlet opening located in the plating region of the cell and positioned beneath the anodes and cathodes so that the liquid-gas mixture is forced from the mixing chamber through the feed tube and then into the plating region of the cell, from whence the liquid-gas mixture flows upwardly through the plating region between the anodes and cathodes and then overflows from an upper portion of the cell located above the level of the anodes and cathodes.

11. Apparatus as recited in claim 9 in which said anode and cathode are horizontally spaced from each other and said passage is a vertical passage, and in which said cell is in the form of an open-topped enclosure having said opening means thereinto disposed beneath said anode and cathode, said apparatus further comprising a tank having said cell set therein and adapted to receive liquid-gas mixture overflowing from the open top of said cell after having flowed upwardly therethrough.

12. Apparatus for electroplating a plurality of flat rectangular substrates, which comprises:

an electroplating tank for holding a quantity of a liquid electroyte;

means for suspending the substrates as cathodes vertically in a central region of the tank in a parallel row of substrates to be plated;

means for suspending a plurality of flat rectangular anodes vertically in the tank adjacent to the substrates so that each substrate surface to be plated is positioned in predetermined spaced relationship to a facing surface of a companion anode;

a plating chamber mounted in the central region of the tank and having an open topped rectangular U-shaped cross section with a floor and side walls closely surrounding the substrates and anodes; and means for forming a foam electrolyte consisting a mixture of an inert gas with the liquid electrolyte and for pumping the foam electrolyte into the bottom of the plating chamber in a region located below the anodes and substrates, from which region the foam is forced upwardly through the chamber and through the spaces between the anodes and substrates so as to plate metal from the foam electrolyte into cathodic areas of the surfaces of the substrates when plating potential is applied between the anodes and the substrates, the chamber being arranged so that the used foam electrolyte spills over the upper ends of the chamber walls above the upper portions of the anodes and substrates and overflows into the surface of the liquid electrolyte in the tank, from which point the inert gas escapes and the liquid electrolyte can be recirculated to the system.

13. Apparatus as recited in claim 12, wherein the means for forming the foam and pumping the foam electrolyte comprises:

a feed tube mounted in the tank and having a vertical portion with a closed upper end located away from the plating chamber;

means for pumping the liquid electrolyte into the upper end of the tube; and means for forcing the inert gas under pressure vertically downward into the feed tube below the upper end thereof so that the gas mixes with the liquid to form the foam in a mixing chamber section of the feed tube located just below the point where the gas enters;

the feed tube having an L-shaped portion located below the mixing chamber section extending between the mixing section and opening at points near the bottom of the plating chamber for conveying the electrolyte foam through the feed tube to the plating chamber.

* * * * *